United States Patent
Khayrallah

Patent Number: 6,112,326
Date of Patent: Aug. 29, 2000

[54] PRECODING TECHNIQUE TO LOWER THE BIT ERROR RATE (BER) OF PUNCTURED CONVOLUTIONAL CODES

[75] Inventor: Ali S. Khayrallah, Apex, N.C.

[73] Assignee: Ericsson Inc., Research Triangle Park, N.C.

[21] Appl. No.: 09/017,387

[22] Filed: Feb. 2, 1998

[51] Int. Cl.[7] .................................................. H03M 13/03
[52] U.S. Cl. ......................................................... 714/790
[58] Field of Search .................................. 714/790, 786, 714/746

[56] References Cited

U.S. PATENT DOCUMENTS

| | | | |
|---|---|---|---|
| 5,408,502 | 4/1995 | How | 375/340 |
| 5,428,631 | 6/1995 | Zehavi . | |
| 5,600,677 | 2/1997 | Citta et al. | 375/296 |
| 5,742,622 | 4/1998 | Claydon et al. | 714/789 |
| 5,848,020 | 12/1998 | Mori | 365/230.06 |

FOREIGN PATENT DOCUMENTS 0716529  6/1996  European Pat. Off. .

OTHER PUBLICATIONS

Lee, L.H.C., "New Rate–Compatible Punctured Convolutional Codes for Viterbi De–coding", IEEE Transactions on Communications, vol. 42, No.12, Dec. 1, 1994, pp. 3073–3079.

Wolf, Jack Keil and Zehavi, Ephraim, "P[2] Codes: pragmatic Trellis Coces Utilizing Punctured Convolutional Codes", IEEE Communications Magazine, vol. 33, No.2, Feb. 1955, pp. 94–99.

"Precoding For Convolutional Codes", Ali S. Khayrallah. Published in *Proceedings of IEEE*, ICC 1996.

"On the Minimum Bit–Error Rate of Linear Codes", Ali S. Khayrallah. *IEEE Transactions On Information Theory*, vol. 41, No. 5, Sep. 1995.

"Rate–Compatible Punctured Convolutional Codes (RCPC Codes) and Their Applications", Joachim Hagenauer, *IEEE Transactions on Communications*, vol. 36, No. 4, Apr. 1988.

T. Fujino, et al. "Development of a Concatenated Reed–Solomon/Viterbi FEC Combined Modem and its Field Test Via 14/11GHz", *IEEE* 1989, pp. 1080–1087.

*Primary Examiner*—Albert De Cady
*Assistant Examiner*—Shelly A Chase
*Attorney, Agent, or Firm*—Wood, Phillips, VanSanten, Clark & Mortimer

[57] ABSTRACT

An error control coding system for transmitting/receiving an information signal across a channel is provided. The error control coding system includes a precoder block including a plurality of precoders defined by a corresponding plurality of precoder matrices, the precoder block applying a select precoder matrix to the information signal and generating a precoded information signal. An encoder applies a convolutional code defined by a generator matrix having a first convolutional code rate to the precoded information signal to generate a coded information signal at the first convolutional code rate. A puncturing block includes a plurality of puncturing systems defined by a corresponding plurality of puncturing matrices, the puncturing block applying a select puncturing matrix to the coded information signal to generate a punctured information signal at an effective second convolutional code rate higher than the first convolutional code rate. The punctured information signal is transmitted across the channel, wherein the select precoder matrix is tuned to the select puncturing matrix to reduce bit error rate in the transmitted punctured information signal.

17 Claims, 2 Drawing Sheets

PRECODING TECHNIQUE TO LOWER THE BIT ERROR RATE (BER) OF PUNCTURED CONVOLUTIONAL CODES

TECHNICAL FIELD OF THE INVENTION

The present invention is directed toward a punctured convolutional coding system, and, more particularly, toward preceding a punctured convolutional coding system to lower the bit error rate (BER) performance of the system.

BACKGROUND OF THE INVENTION

Convolutional codes are generally used as error control codes to try and protect data that is being attached by noise, interference, etc., during transmission. The basic premise behind a convolutional coding system is to send more bits than is needed to describe the information, with the redundant or extra bits aiding in the fight against noise and/or interference pollution of the data. Performance is measured by the probability of error, and is commonly referred to as the bit error rate (BER) determined by the following formula:

$$BER = \frac{\# \text{ of bits in error}}{\text{total } \# \text{ of bits transmitted}}$$

Acceptable BER levels vary depending upon the type of information being transmitted. For example, a speech coder outputting information over a wireless channel may be able to withstand a 3% BER with the person listening at the other end still being able to easily understand the transmitted speech.

The design of an error correction convolutional coding system generally consists of selecting a fixed convolutional code with a certain rate and correction capability matched to the protection requirements of the data to be transmitted, and adapted to the average or worst channel conditions to be expected. Such fixed convolutional code is commonly known as a mother convolutional code, or simply a mother code, and is generally applied to the data by an encoder. The convolutional code rate is generally defined by the formula k/n, where k is the number of input bits that the encoder accepts at a time, and n is the number of output bits that the encoder produces at a time, where n>k. Thus, an input block of l bits results in an output block of ln/k bits, where l is assumed to be a multiple of k, without any real loss of generality.

At the receiving end of the system, a convolutional decoder receives the transmitted information signal and conventionally figures out which of the codewords was most likely to have happened. Among convolutional decoders, Viterbi decoders are popular for use in convolutional coding systems. An uncoder (the opposite of an encoder) then effectively uncodes the received signal resulting in the transmitted information signal. The transmitted information signal will have a bit error rate (BER) associated with it, preferably at or below the acceptable level.

In many cases, however, more flexibility is desired in the coding rate since the data to be transmitted may have different error protection needs. For example, it may be desirable to utilize different coding rates for different types of information to be transmitted, such as, but not limited to, speech, control information, data transmission, etc.

For practical purposes, it is also desirable to utilize one encoder and one decoder, both being modifiable without changing their basic structure. Generally, decoder complexity is the main concern, since it is generally the decoder which takes up the most memory space at the receiver end of the coding system. Both flexibility in the coding rate and decoder simplicity can be achieved by a technique commonly known as puncturing.

Puncturing is achieved by not transmitting certain code bits, or, as is more commonly known, by puncturing the code. Puncturing results in the reduction of the number of code bits actually transmitted, and results in a coding rate higher than the original mother code rate. For example, assume that in a system utilizing a 1/2 rate mother convolutional code, due to the type of information being transmitted, it is desirable to transmit the information utilizing a 3/4 rate convolutional code. However, to maintain decoder simplicity, it is desirable to utilize a decoder for a 1/2 rate convolutional code, since such a decoder is simpler in design and is less complex to operate than a decoder for a rate 3/4 code. Lower complexity translates into a smaller current and/or memory requirements. By puncturing the 1/2 convolutional code into an effective 3/4 convolutional code, both needs may be satisfied.

In the above example, the information to be transmitted is input to an encoder which applies the mother code rate of 1/2 to the information signal. If the information to be transmitted included 100 bits, 200 bits would be output by the encoder as the coded signal. The coded signal is then conventionally punctured to obtain a punctured signal having an effective convolutional code rate of 3/4. In this example, puncturing decreases the 200 bit coded signal to a 133 bit punctured signal, which is transmitted across the channel, to obtain an effective convolutional code rate of 3/4 (100/133~3/4). Puncturing is generally known in the art, and accordingly, a detailed description of the puncturing technique utilized to reduce the 200 bit coded signal to a 133 bit punctured signal is not needed.

At the receiver end, a decoder for a 1/2 convolutional code rate may be used to decode the 133 bits (3/4 rate) by conventionally shutting off some taps of the decoder or conventionally skipping some steps in the decoding process. Using a 1/2 convolutional code rate decoder and shutting off some taps is simpler than utilizing a decoder specifically designed for a 3/4 convolutional code rate. Thus, transmission quality commensurate with a convolutional code rate of 3/4 is obtained, while maintaining simplicity in the decoder.

Mother codes having a generally low convolutional code rate of 1/2 or 1/3 are conmmonly implemented efficiently in ASICs or DSPs. However, in a given system, at least 2–3 additional code rates are desirable, e.g., 2/3, 5/6, etc., for the transmission of various information such as speech, control, data transmission, etc. For simplicity at the decoding end, it is desirable to puncture these additional code rates from the same mother code.

A problem with conventional puncturing is that an effective punctured convolutional code at rate=A is not as good as, i.e., has a higher BER, than a mother convolutional code at the same rate=A. For instance, in the example set forth above, the 3/4 rate punctured convolutional code has a higher BER than a 3/4 rate convolutional code implemented from scratch and utilized as the mother code.

The present invention is directed to overcoming one or more of the above-mentioned problems.

SUMMARY OF THE INVENTION

In one form of the present invention, an error control coding system for transmitting/receiving an information signal across a channel is provided, the error control coding system including a transmitter having a precoder receiving the information signal and generating a precoded information signal, and an encoder receiving the precoded information signal and generating a coded information signal to be transmitted across the channel, wherein the precoder is tuned to the encoder, and a receiver having a decoding system receiving the coded information signal from the channel and generating an uncoded information signal, and an inverse precoder de-precoding the uncoded information signal to generate a transmitted information signal.

In one aspect of the present invention, the decoding system includes a decoder receiving the coded information signal from the channel and generating a coded sequence estimate, and an uncoder receiving the coded sequence estimate and generating the uncoded information signal.

In one aspect of the present invention, the encoder applies a convolutional code defined by a generator matrix to the precoded information signal to generate the coded information signal, the precoder applies a precoder matrix to the information signal to generate the precoded information signal, and the precoder matrix is tuned to the generator matrix such that the bit error rate in the coded information signal transmitted across the channel is reduced.

In another aspect of the present invention, the uncoder applies an inverse of the generator matrix to the coded sequence estimate to generate the uncoded information signal, and the inverse precoder applies an inverse of the precoder matrix to the uncoded information signal to generate the transmitted information signal.

In another form of the present invention, an error control coding system for transmitting/receiving an information signal across a channel is provided, the error control coding system including a precoder applying a precoder matrix to the information signal and generating a precoded information signal, an encoder applying a convolutional code, defined by a generator matrix having a first convolutional code rate, to the precoded information signal and generating a coded information signal at the first convolutional code rate, a puncturing system applying a puncturing matrix to the coded information signal at an effective second convolutional code rate higher than the first convolutional code rate, said punctured information signal transmitted across the channel, wherein the precoder matrix is tuned to the puncturing matrix to reduce bit error rate in the transmitted punctured information signal, an inverse puncturing system receiving the transmitted punctured information signal and applying an inverse of the puncturing matrix thereto generating an unpunctured information signal, a decoder mapping the unpunctured information signal into a maximum coded sequence estimate, an uncoder applying an inverse of the generator matrix to the maximum coded sequence estimate and generating an uncoded information signal, and an inverse precoder applying an inverse of the precoder matrix to the uncoded information signal and generating a transmitted information signal.

In one aspect of the present invention, the decoder includes a Viterbi decoder.

In yet another form of the present invention, an error control coding system for transmitting/receiving an information signal across a channel is provided, the error control coding system including a precoder block including a plurality of precoders defined by a corresponding plurality of precoder matrices, the precoder block applying a select precoder matrix to the information signal and generating a precoded information signal, an encoder applying a convolutional code defined by a generator matrix having a first convolutional code rate to the precoded information signal to generate a coded information signal at the first convolutional code rate, a puncturing block including a plurality of puncturing systems defined by a corresponding plurality of puncturing matrices, the puncturing block applying a select puncturing matrix to the coded information signal to generate a punctured information signal at an effective second convolutional code rate higher than the first convolutional code rate, said punctured information signal transmitted across the channel, wherein the select precoder matrix is tuned to the select puncturing matrix to reduce bit error rate in the transmitted punctured information signal, an inverse puncturing block including a plurality of inverse puncturing systems defined by a corresponding plurality of inverse puncturing matrices, the puncturing block applying an inverse of the select puncturing matrix to the transmitted punctured information signal to generate an unpunctured information signal, a decoder mapping the unpunctured information signal into a maximum coded sequence estimate, an uncoder applying an inverse of the generator matrix to the maximum coded sequence estimate to generate an uncoded information signal, and an inverse precoder block including a plurality of inverse precoders defined by a corresponding plurality of inverse precoder matrices, the inverse precoder block applying an inverse of the select precoder matrix to the uncoded information signal to generate a transmitted information signal.

In yet another form of the present invention, the first convolutional code rate of the generator matrix is selected from the group consisting of 1/2 and 1/3.

In still another form of the present invention, the second convolutional code rate of the select precoder matrix is selected from the group consisting of 4/5, 2/3, 4/7 and 4/9.

A method of precoding information signal transmitted in a punctured error control code system is provided, the method including the steps of applying a precoder matrix to the information signal to produce a precoded information signal, applying a generator matrix having a first convolutional code rate to the precoded information signal to produce a coded information signal, applying a puncturing matrix having a second convolutional code rate higher than the first convolutional code rate to the coded information signal to produce a punctured information signal, transmitting the punctured information signal across a channel, receiving the transmitted punctured information signal, applying an inverse of the puncturing matrix to the received punctured information signal to produce an unpunctured information signal, decoding the unpunctured information signal to produce a maximum code estimate sequence, applying an inverse of the generator matrix to the maximum code estimate sequence to produce an uncoded information signal and applying an inverse of the precoder matrix to the uncoded information signal to produce a transmitted information signal, wherein the precoder matrix is tuned to the puncturing matrix so as to reduce bit error rate in the transmitted punctured information signal.

An object of the present invention is to reduce the BER in a punctured convolutional code system with little impact in system complexity.

Another object of the present invention is to reduce the BER in a punctured convolutional code system with little impact in decoder complexity.

Another object of the present invention is to provide unequal error protection in a punctured convolutional code system with little impact in system and/or decoder complexity.

Other aspects, objects and advantages of the present invention can be obtained from a study of the application, the drawings, and the appended claims.

DETAILED DESCRIPTION OF THE PREFERRED EMBODIMENTS

Many wireless communication systems use one mother convolutional code of a low rate, e.g., 1/2, 1/3, etc., and use puncturing to obtain codes of higher rates, e.g., 2/3, 5/6, etc. Examples of such communication systems include, but are not limited to, D-AMPS, GSM and ACeS. Essentially, a convolutional code is utilized as an error control code to reduce the effects of noise, interference, etc. Such noise/interference, etc. reduction is realized, through the use of a convolutional code, by sending more bits than is needed. The number of additional bits depends on the convolutional code rate required.

Puncturing is conventionally used in wireless communication systems when the information being transmitted requires different error protection needs, requiring different convolutional code rates. However, a disadvantage associated with puncturing is that error events tend to cause many bit errors than in a coding scheme specifically designed for the same effective rate, thus increasing the bit error rate (BER) in the transmitted information signal.

Figure 1:
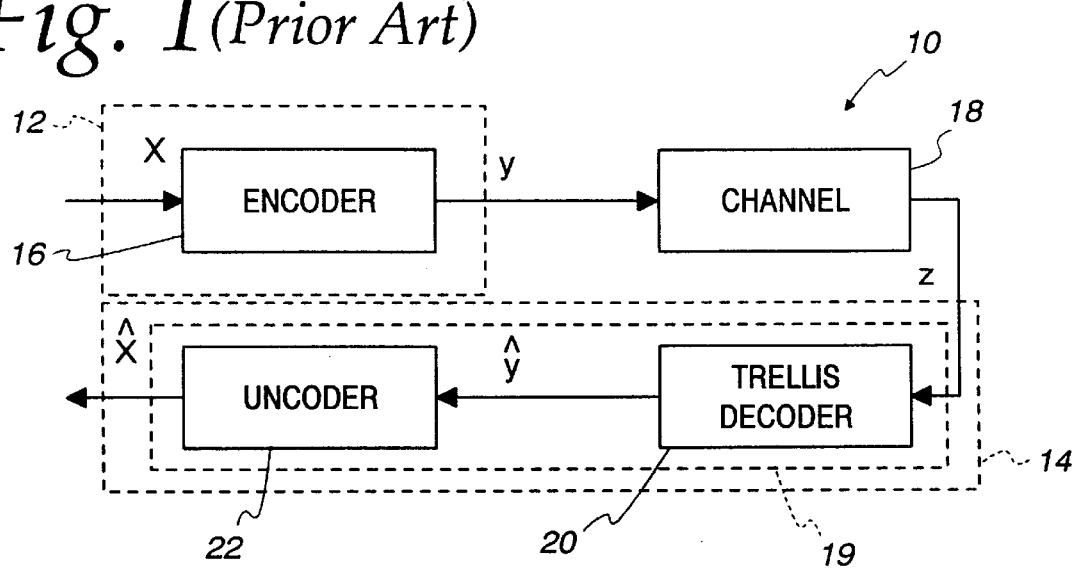
FIG. 1 depicts a block diagram of a prior art error control code system.

FIG. 1 depicts a block diagram of a conventional error control coding system shown generally at 10. The coding system 10 includes a transmitter 12 and a receiver 14. The transmitter 12 includes an encoder 16 receiving an information sequence/signal x(D), applying a mother convolutional code thereto, and outputting a coded sequence/signal y(D). The coded sequence y(D) is transmitted across a channel 18 where it is received, as sequence/signal z(D), at the receiver 14. A decoding system 19 receives the sequence z(D) and generates the corresponding output sequence x(D), the transmitted information signal. More specifically, a trellis decoder 20 receives the sequence z(D) and maps the received sequence z(D) into a maximum likelihood coded sequence/signal estimate ŷ(D). An uncoder 22 receives the coded sequence estimate ŷ(D) and determines the corresponding output sequence x̂(D), the transmitted information signal. A more detailed discussed of the coding system 10 is provided below.

Generally, a convolutional code rate is defined as a number of input bits divided by the number of output bits, and is generally less than one. The convolutional code applied by the encoder 16 may be an (n,k) convolutional code with a rate of k/n (where k=the number of bits input to the encoder 16, and n=the number of bits output from the encoder 16), which can be described by k×n generator matrix G(D) whose elements are rational functions in the delay element D. If all of the elements of G(D) are polynomials, G(D) is said to be feedforward, otherwise it is said to have feedback. The information sequence x(D) may be written as $$x(D) = \sum_i x_i D^i,$$

where $x_i = (x_{ik} \ldots x_{(i+1)k-1})$. Similarly, the coded sequence y(D) may be written as $$y(D) = \sum_i y_i D^i,$$

where $y_i = (y_{in} \ldots y_{(i+1)n-1})$.

Let $G^{-1}(D)$ be a right inverse of $G(D)$, such that $G(D)G^{-1}(D) = I$. Further, let $G^{-1}(D)$ be a pseudo-right inverse, such that $G(D)G^{-1}(D) = ID^s$ for some $s \geq 0$. This s represents a trivial delay that does not effect operation.

For a given G(D), the corresponding trellis in the trellis decoder 20 with the appropriate number of states may be constructed. A Viterbi decoder is preferably used on the trellis, in which case the decoding complexity is proportional to the number of states, however, other decoders are also contemplated.

The coded sequence y(D) is fed to a modulator (not shown), followed by the rest of the transmitter 12 stages (not shown), and transmitted across the channel 18. The signal, subjected to fading, interference and noise, is captured and processed by a demodulator (not shown) in the receiver 14. The output z(D) of the demodulator (not shown) is fed to the trellis decoder 20.

The trellis decoder 20 maps the received sequence z(D) into a maximum likelihood coded sequence estimate ŷ(D). The uncoder 22 (the inverse of the encoder 16) receives the coded sequence estimate y(D) and outputs the corresponding input sequence x̂(D), the transmitted information signal. The uncoder 22 can be implemented by any right inverse $G^{-1}(D)$. The separate decoder and uncoder operations permits changing of the uncoder 22 in sympathy with the encoder 16, while keeping the trellis decoder 20 fixed. Alternatively, the decoder 20 and uncoder 22 can be combined to produce x̂(D) directly, without explicitly producing ŷ(D).

In Viterbi decoding, the analysis focuses on the fundamental paths on the state diagram, i.e., those paths that start and end in state zero but do not visit it in between. For convenience, each fundamental path is identified by its corresponding coded sequence, which is referred to herein as a fundamental coded sequence.

The Hamming weight is denoted by w(.). The sets of fundamental coded sequences are defined as $$Y_l = \{y(D) : w(y(D)) = l\}$$

for all l. Let $A_l$ denote the size of $Y_l$. Then of course $A_0 = 1$, and the smallest l>0 with $A_l > 0$ is the free distance $d_{free}$.

The event error rate $P_e$ is bounded by $$P_e \leq \sum_{l>0} A_l \gamma^l,$$

and for an Additive White Gaussin Noise (AWGN) channel with no quantization, $$\gamma = \exp\left(-\frac{k}{n}\frac{E_b}{N_0}\right)$$

where $E_b$ is the energy per information bit and $N_0$ is the noise power spectral density. Similar expressions can be written for other channels, in particular Rayleigh fading channels and Rician fading channels.

For the sets of fundamental coded sequences, the corresponding sets of input sequences are given by $$X_l = \{x(D) : x(D)G(D) \in Y_l\},$$

for all l. The set weights are defined by $$B_l = \sum_{x(D) \in X_l} w(x(D)),$$

Accordingly, the bit error rate (BER) $P_b$ upper bounded by $$P_b \leq 1/k \sum_{l>0} B_l \gamma^l.$$

Figure 2:
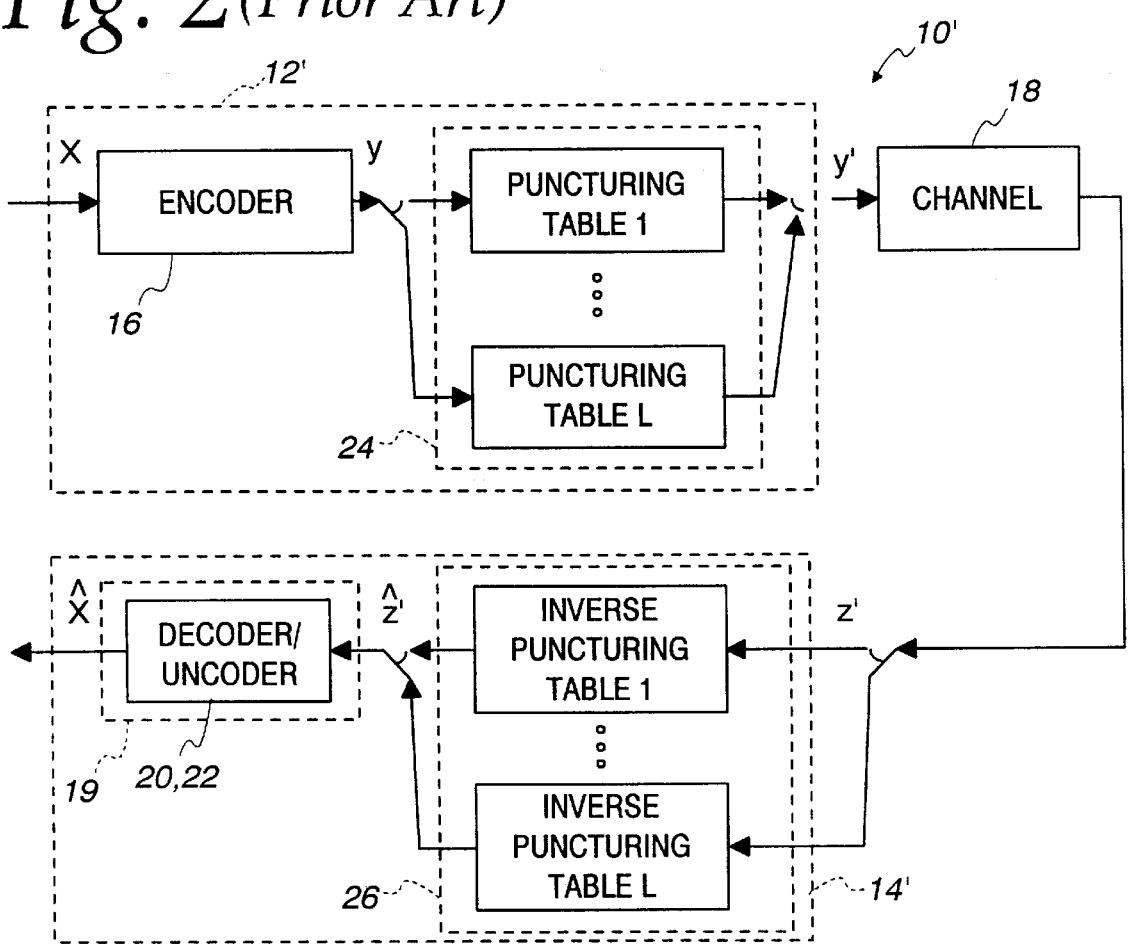
FIG. 2 depicts a block diagram of another prior art error control code system.

FIG. 2 depicts a conventional punctured error control coding system shown generally at 10' with like elements in FIG. 1 indicated with the same reference numbers and those elements that have been modified indicated with a prime ('). Essentially, puncturing tables 24, consisting of plural puncturing tables 1, 2, . . . L, have been added to the transmitter 12'. Similarly, inverse puncturing tables 26, consisting of plural inverse puncturing tables 1, 2, . . . L which correspond to respective puncturing tables 1, 2, . . . L shown generally at 24, have been added to the receiver 14'. Basic operation is as follows.

The encoder 16 recites the information sequence x(D), applies a mother convolutional code thereto, and outputs the coded sequence y(D). The coded sequence y(D) is applied to a select one of the puncturing tables 24 depending upon the type of information to be transmitted. A select puncturing table 24 effectively punctures the coded sequence y(D) to produce a punctured coded sequence y'(D) which is transmitted across the channel 18. More specifically, the select puncturing table 24 conventionally removes certain bits from the coded sequence y(D) to generate the punctured coded sequence y'(D).

The punctured coded sequence y'(D) is transmitted across the channel 18, where it is subjected to noise, interference, etc., and received as sequence z'(D) at the receiver 14'. The received sequence z'(D) is input to a select inverse puncturing table 26 corresponding to the select puncturing table 24 utilized in puncturing the coded sequence y(D) at the transmitter 12'. The select inverse puncturing table 26 conventionally inserts zeros in the received signal z'(D) where bits were removed by the select puncturing table 24 to generate an unpunctured received signal ẑ'(D). The addition of bits by the inverse puncturing tables 26 enable the decoder 20, which is set up to receive a certain number of bits corresponding to the mother convolutional code rate, to decode the received sequence ẑ'(D). The decoder 20 and uncoder 22 of decoding system 19 conventionally decode and uncode the received sequence ẑ'(D) as previously described, and output the corresponding output sequence x̂(D), the transmitted information signal.

As previously noted, puncturing results in a reduction of the number of code bits actually transmitted, and results in a coding rate higher than the original k/n of the mother code. The puncturing scheme can be described by a puncturing table T of zeros and ones, of size n×m, where m is defined as the period. A coded sequence y(D) is processed in consecutive blocks of nm bits. Suppose we start at index 0. Then we take the coded bits of the mother code $$y^T_0, \ldots, y^T_{m-1}$$

where $y^T_0$ consists of the first n bits arranged in a column, and so on. We keep the bits of y(D) at the locations where T contains a one, and we remove, or puncture, the remaining bits. The other blocks are punctured in the same way. If q denotes the number of ones in T, then we are keeping q bits out of nm coded bits (corresponding to km information bits), effectively resulting in a (q, km) code with rate km/q>kn.

A simple example will help clarify the above. Consider a (3,1) mother code, and a puncturing table T of size 3×4, i.e., with period m=4. Say the table has q=7 ones. The punctured code is effectively a (7,4) code having a rate 4/7.

The higher rate also means lower performance, is generally as expected. The biggest advantage resulting from puncturing is in the encoding and decoding stages. The punctured code can in fact be encoded and decoded using its own encoder and decoder. However, it is more advantageous from an implementation viewpoint to use the encoder and decoder of the original mother code, and supplement them with puncturing tables.

A problem with conventional puncturing is that the bit error rate (BER) of a transmitted signal is higher for a punctured convolutional code rate than for a mother convolutional code rate at the same rate. For instance, an effective punctured convolutional code at rate=A is not as good as, i.e., has a higher BER, than a mother convolutional code at the same rate=A.

Figure 3:
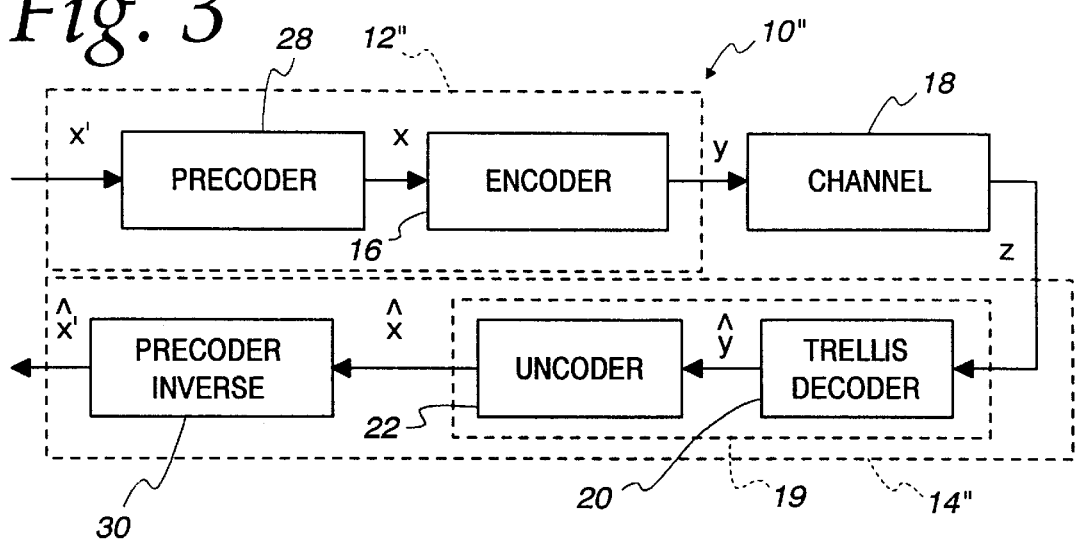
FIG. 3 depicts a block diagram of a precoded error control code system according to a first embodiment of the present invention.

Referring now to FIG. 3, an error control coding system in accordance with the present invention is shown generally at 10" with like elements in FIG. 1 indicated with the same reference numbers and those elements that have been modified indicated with a double prime ("). Basically, a precoder 28 has been added to the transmitter 12", and a corresponding inverse precoder 30 has been added to the receiver 14". The precoder 28 is tuned to the mother code rate applied by the encoder 16 to reduce the BER in the transmitted information signal. Basic operation of the error control system 10" will now be described.

An information sequence x'(D) is input to the precoder 28. The precoder 28 precodes the information sequence x40 (D), as will be described later, and outputs the precoded sequence x(D). The precoded sequence x(D) is encoded by the encoder 16 and transmitted across the channel 18 to the decoding system 19 in the receiver 14". The decoding system 19, including the trellis decoder 20 and uncoder 22, decodes and uncodes the received sequence z(D) in the same manner as previously described with respect to FIG. 1, and generates a decoded/uncoded sequence x(D). The precoder inverse 30 receives the decoded/uncoded sequence x̂(D) from the uncoder 22 and effectively unprecodes the signal to generate the transmitted information sequence/signal x̂'(D). Due to precoding, the transmitted information sequence x̂'(D) will have a lower BER than the transmitted information sequence x̂(D). The following is a more detailed description of the precoder 28 and precoder inverse 30 shown in FIG. 3.

The precoder 28 includes a k×k invertible matrix F(D), whose elements are rational functions in D. Accordingly, the matrix G'(D)=F(D)G(D) may be defined as a new generator matrix for the same code. The matrix F(D) is referred to herein as a precoder matrix.

In general, the trellis corresponding to G'(D) will have more states than the one for G(D), however, the latter is preferably used for decoding. In order to use G(D) for decoding, $G^{-1}(D)$ needs to be followed by $F^{-1}(D)$, the inverse of the precoder matrix F(D), which is equivalent to the inverse of G'(D).

The corresponding sets of input sequences are defined by $$X'_l = \{x'(D) : x'(D)G'(D) \in Y_l\}.$$

From $X'_l$, the set weights $B'_l$ and bit error rate $P'_b$ are as previously defined. Precoding is generally used to try to reduce the information way of the dominant error events. To do this, the precoder is chosen to reduce $B'_l$ for small weights j, e.g., $j=d_{free}$, and $j=d_{free}+1$ as a secondary measure. This in turn reduces the bit error rate.

In order to find an appropriate precoder, an exhaustive search can be undertaken. Such a search becomes very complex even for precoders of moderate size. It has been found effective to attack the problem by constructing precoder inverses $F^{-1}(D)$. Specifically, the columns of $F^{-1}(D)$ are constructed one by one, while making sure that $F^{-1}(D)$ has full rank. In many cases, this does not require a search. In addition to the computational advantage, it is a more direct approach, since it deals directly with the elements of $X_l$. It is important to note that once an appropriate precoder has been designed, the complexity of its operation and that of its corresponding inverse precoder are small.

With a column vector u(D) of size k, the components of u(D) are rationals. The elements of the set $X_l$ are projected onto u(D) to obtain the scalars $$x(D)u(D),$$

and $\beta_l$ denotes the sum of the weights of the scalars $$B_l = \sum_{x(D) \in X_l} w(x(D)u(D))$$

If u(D) were the j-th column of some precoder inverse $F^{-1}(D)$, then β would coincide with the set weight $B'_l{}^{(j)}$. Thus the key is to identify those vectors u(D) that result in a small projection weight $\beta_l$.

A program is utilized that computes the projection weights for all vectors u(D) whose components are polynomials of degree $\leq \mu$ for some $\mu$. There are $2^{k\mu}-1$ such vectors, excluding the all-zero vector. The program input consists of the sets $X_{dfree}$ and $X_{dfree+1}$, and $\mu$. The program first reorders the vectors as $$u^{(1)}(D), u^{(2)}(D), \ldots u^{(2k\mu-1)}(D),$$

ranked in the order of their increasing projection weights $$\beta^1_{dfree} \leq \beta^2_{dfree} \leq \ldots \leq \beta^{2p\mu-1}_{dfree}.$$

Ties are broken using the projection weights $\beta^i_{dfree+1}$ of $X_{dfree+1}$.

The second step is to identify k indices $l_1, \ldots l_k$, such that the corresponding vectors $u^{(l)}{}_i(D)$ are independent, and the sum $$\sum_{i=1}^{k} \beta^{l_i}_{d_f}$$

is minimized. Ties are broken by minimizing the sum $$\sum_{i=1}^{k} \beta^{l_i}_{d_f+1}$$

In general, because of the independence condition, there is no systematic solution, and it may be necessary to conduct a full search to determine the best $l_1, \ldots l_p$. The following approach has been found to be successful. First $l_1$ is set equal to 1. Then starting from index 2, the ordered list is followed to find the first vector, vector $u^{(i)}(D)$, that is independent from $u^{(l_1)}(D)$. Next $l_2$ is set to i. Then starting from index i+1, the ordered list is followed to find the first vector, vector $u^{(i')}(D)$, that is independent from $u^{(l_1)}(D)$ and $u^{(l_2)}(D)$. Then $l_3$ is set to i', and so on. This approach is believed to yield the optimal solution.

As an example, consider a convolutional code from Lin and Costello, Error control coding: fundamentals and applications, Prentice Hall, 1983, with n=3, k=2, realized by $$G(D) = \begin{bmatrix} 1+D & D & 1+D \\ D & 1 & 1 \end{bmatrix}$$

This code has $d_{free}=3$, $$X_3 = \{x^{(1)}(D)=(0,1), x^{(2)}(D)=(1, 1+D)\},$$

and $$X_4 = \{(1,D), (1,1), (D, 1+D+D^2), (1+D, D+D^2), (1+D^2, 1+D+D^2+D^3)\}.$$

Then $$A_3=2, B_3=4, B_3{}^{(0)}=1, B_3{}^{(1)}=3, A_4=5, B_4=18, B_4{}^{(0)}=7, B_4{}^{(1)}=11,$$

and $$P_b \approx 2\gamma^3 + 9\gamma^4,$$
$$P_b^{(0)} \approx \gamma^3 + 7\gamma^4,$$
$$P_b^{(1)} \approx 3\gamma^3 + 11\gamma^4.$$

Since $x^{(1)}(D)$ and $x^{(2)}(D)$ are independent, the precoding matrix is constructed as $$F(D) = \begin{bmatrix} 0 & 1 \\ 1 & 1+D \end{bmatrix}.$$

to get $$X'_3 = \{x'^{(1)}(D)=(1,0), x'^{(2)}(D)=(0,1)\}.$$

The inverse of F(D) is given by $$F^{-1}(D) = \begin{bmatrix} 1+D & 1 \\ 1 & 0 \end{bmatrix}.$$

Resulting in $$X'_4 = \{(1,1), (D,1), (1,D), (1+D, 1+D), (0, 1+D^2)\}.$$

It follows that $$B'_3=2, B'_3{}^{(0)}=1, B'_3{}^{(1)}=1, B'_4=12, B'_4{}^{(0)}=5, B'_4{}^{(1)}=7.$$

Hence $$P_b \approx \gamma^3 + 6\gamma^4,$$
$$P_b^{(0)} \approx \gamma^3 + 5\gamma^4,$$
$$P_b^{(1)} \approx \gamma^3 + 7\gamma^4.$$

Thus roughly, the BER of subsequence 0 is reduced by a factor of 3, and the total BER is halved.

For $\mu=2$, the sorted vectors $u^i(D)$ and their projections are given by $$u^{(1)}(D) = (1+D, 1)^T, \quad \beta_3^1 = 1, \quad \beta_4^1 = 5$$
$$u^{(2)}(D) = (1, 0)^T, \quad \beta_3^2 = 1, \quad \beta_4^2 = 7$$
$$u^{(3)}(D) = (D, 0)^T, \quad \beta_3^3 = 1, \quad \beta_4^3 = 7$$
$$\vdots \quad \vdots$$
$$u^{(15)}(D) = (D, 1+D, 1)^T, \quad \beta_3^{15} = 5, \quad \beta_4^{15} = 11,$$

Clearly in this case, $l_1=1$ and $l_2=2$, and there is no need for a search. $F^{-1}(D)$ is constructed with $u^{(1)}(D)$ as the first column and $u^{(2)}(D)$ as the second column, coinciding with the previous choice of $F^{-1}(D)$.

Figure 4:
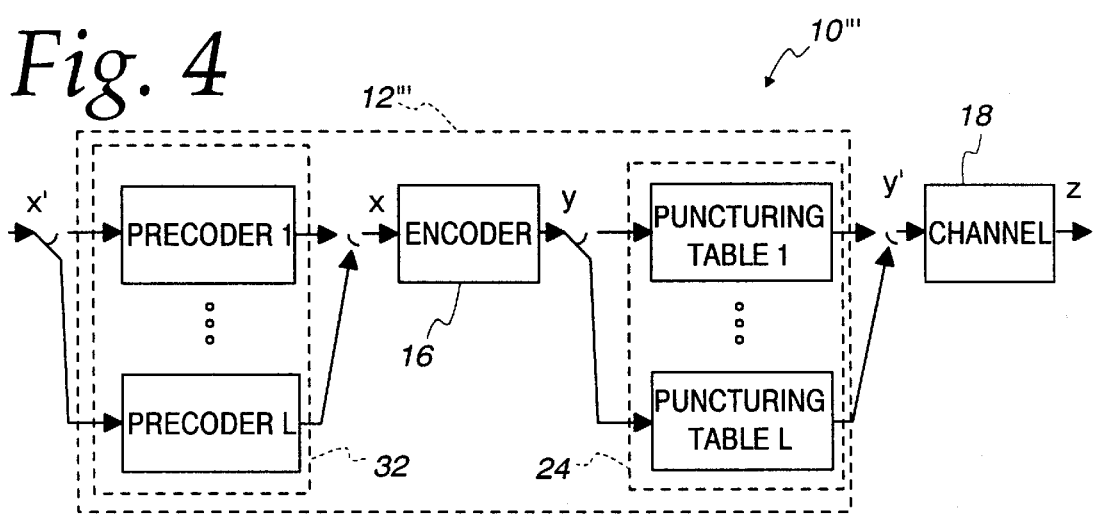
FIG. 4 depicts a block diagram of a transmitter included in an error control code system according to a second embodiment of the present invention.
Figure 5:
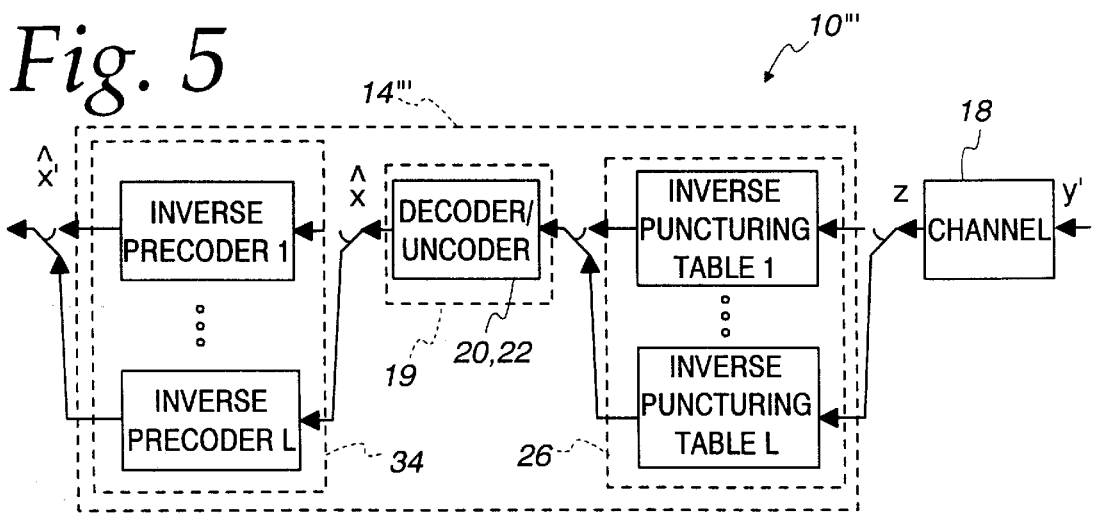
FIG. 5 depicts a block diagram of a receiver included in the error control code system according to the second embodiment of the present invention.

Referring now to FIGS. 4–5, an error control coding system is depicted generally at 10''' with like elements in FIG. 2 indicated with the same reference numbers and those elements that have been modified indicated with a triple prime ('''). Basically, a precoder block 32 consisting of a plurality of precoders 1, 2, . . . L has been added to the transmitter 12''', while a corresponding inverse precoder block 34 consisting of a plurality of inverse precoders 1, 2, . . . L has been added to the receiver 14'''.

Each of the precoders 32 is tuned to a different punctured code associated with one of the puncturing tables 24. By using different precoders 32 tuned to the different punctured codes in the puncturing tables 24, the bit error rate (BER) of the punctured codes can be improved at a small cost in the increase of complexity. The error control coding system 10''' operates in the same manner as previously described with respect to FIG. 2, but including the preceding step as previously described with respect to FIG. 3. Accordingly, a detailed description is not necessary.

As shown in FIGS. 4–5, if there are L different puncturing tables 24 (one can include the mother code itself), then for each puncturing table 24 a different precoder 32 is chosen specifically for the punctured code defined by the associated puncturing table 24. For example, precoder 1 may be associated with puncturing table 1, which may be associated with inverse puncturing table 1, which may be associated with inverse precoder 1. Of particular importance is the fact that only one decoder 20, that of the mother code, is needed as shown in FIGS. 4–5.

Thus, utilizing the system shown in FIGS. 4 and 5, results in the advantage of a punctured code system, while eliminating the disadvantage associated with the encoders of codes obtained by puncturing, which is that error events tend to cause many bit errors increasing the BER. Embodiments of the present invention are given in the following example.

Consider the (3,1) mother code with 32 states:

$$G(D)=[1+D+D^2+D^3+D^5\ 1+D^2+D^3+D^5\ 1+D^3+D^4+D^5],$$

using punctured codes with rates 4/5, 2/13, 4/7, and 4/9. The precoders are designed specifically for each punctured code.
Rate 4/5
For rate 4/5, it is conventionally determined that $d_{free}=4$, and $B_4=40, B_5=381.$ A precoder matrix following the principles previously described yields $B'_4=20, B'_5=208,$ effectively reducing the BER by 50%.
It is given by $$F(D) = \frac{1}{p(D)}\left(\begin{bmatrix}0101\\0011\\0010\\0011\end{bmatrix} + \begin{bmatrix}0000\\1101\\1001\\0001\end{bmatrix}D + \begin{bmatrix}1001\\0011\\1110\\0110\end{bmatrix}D^2 + \begin{bmatrix}1100\\0010\\1110\\1011\end{bmatrix}D^3 + \begin{bmatrix}0000\\0100\\0000\\0100\end{bmatrix}D^4\right)$$

where $p(D)=1+D+D^2+D^4$.
Rate 2/3
For rate 2/3, it is conventionally determined that $d_{free}=6$, and $B_6=192, B_8=0.$ A precoder matrix following the principles previously described yields $B'_6=140, B'_7=0,$ effectively reducing the BER by 27%.
It is given by $$F(D) = \frac{1}{p(D)}\left(\begin{bmatrix}0000\\0000\\0100\\0001\end{bmatrix} + \begin{bmatrix}0111\\0001\\0111\\0000\end{bmatrix}D + \begin{bmatrix}1000\\1110\\1000\\1110\end{bmatrix}D^2\right)$$

where $p(D)=1+D$.
Rate 4/7
For rate 4/7, it is conventionally determined that $d_{free}=6$, and $B_6=5, B_7=59.$ A precoder matrix following the principles previously described yields $B'_6=1, B'_7=51,$ effectively reducing the BER by 80%.
It is given by $$F(D) = \left(\begin{bmatrix}0000\\0001\\0000\\0001\end{bmatrix} + \begin{bmatrix}0000\\0101\\0001\\0101\end{bmatrix}D + \begin{bmatrix}0001\\1010\\0100\\1001\end{bmatrix}D^2\right)$$

Rate 4/9
For rate 4/9, it is conventionally determined that $d_{free}=8$, and $B_8=2, B_9=6.$ A precoder matrix following the principles previously described yields $B'_8=1, B'_9=3,$ effectively reducing the BER by 50%.

It is given by $$F(D) = \left( \begin{bmatrix} 0110 \\ 0000 \\ 0000 \\ 0000 \end{bmatrix} + \begin{bmatrix} 1110 \\ 0000 \\ 0110 \\ 0001 \end{bmatrix} D + \begin{bmatrix} 0000 \\ 0100 \\ 0000 \\ 0100 \end{bmatrix} D^2 \right)$$

Note that the first two precoders have feedback. Their corresponding inverses do not have feedback except for a possible trivial delay. A non-trivial feedback at the inverse would cause error propagation, since the inverse is located at the receiver side.

Unequal Error Protection

It is helpful to define the input subsequences $$x^{(j)} = \sum_i x_{ik+j} D^i,$$

for j=0 ... k−1. Those subsequences may represent different streams of information that are being coded together, or substreams from the same source that have different importance, as in a natural binary representation of integers, or the output of a speech coder. In the context of punctured codes, by using precoding it is also possible to modify the BER of the individual subsequences, so that those subsequences that are particularly susceptible to errors would be protected more, thus resulting in unequal error protection.

Thus, by selectively precoding the input sequence prior to puncturing, effectively reduces the bit error rate (BER) of the transmitted signal received at the receiver end. The precoder may be chosen depending upon which puncturing table is utilized to puncture the input sequence prior to transmission.

While the invention has been described with particular reference to the drawings, it should be understood that various modifications could be made without departing from the spirit and scope of the present invention.

What is claimed is:

1. An error control coding system for transmitting/receiving an information signal across a channel, said error control coding system comprising:
a transmitter comprising:
a precoder receiving the information signal and applying a precoder matrix to the information signal to generate a precoded information signal; and
an encoder receiving the precoded information signal and applying a convolutional code defined by a generator matrix to the precoded information signal to generate a coded information signal to be transmitted across the channel,
wherein the precoder matrix is tuned to the generator matrix such that bit error rate in the coded information signal transmitted across the channel is reduced, and
a receiver comprising:
a decoding system receiving the coded information signal from the channel and generating an uncoded information signal; and
an inverse precoder de-precoding the uncoded information signal to generate a transmitted information signal.

2. The system of claim 1, wherein
the encoder applies a k×n generator matrix to the precoded information signal to generate the coded information signal, and
the precoder applies a k×k precoder matrix to the information signal to generate the precoded information signal.

3. The system of claim 1, wherein the decoding system comprises:
a decoder receiving the coded information signal from the channel and generating a coded sequence estimate; and
an uncoder receiving the coded sequence estimate in generating the coded information signal.

4. The system of claim 1, wherein
the uncoder applies an inverse of the generator matrix to the coded sequence estimate to generate the uncoded information signal, and
the inverse precoder applies an inverse of the precoder matrix to the uncoded information signal to generate the transmitted information signal.

5. An error control coding system for transmitting/receiving an information signal across a channel, said error control coding system comprising:
a precoder applying a precoder matrix to the information signal and generating a precoded information signal;
an encoder applying a convolutional code, defined by a generator matrix having a first convolutional code rate, to the precoded information signal and generating a coded information signal at the first convolutional code rate;
a puncturing system applying a puncturing matrix to the coded information signal at an effective second convolutional code rate higher than the first convolutional code rate, said punctured information signal transmitted across the channel,
wherein the precoder matrix is tuned to the puncturing matrix to reduce bit error rate in the transmitted punctured information signal;
an inverse puncturing system receiving the transmitted punctured information signal and applying an inverse of the puncturing matrix thereto generating an unpunctured information signal;
a decoding system receiving the unpunctured information signal and generating an uncoded information signal; and
an inverse precoder applying an inverse of the precoder matrix to the uncoded information signal and generating a transmitted information signal.

6. The system of claim 5, wherein the decoding system comprises:
a decoder mapping the unpunctured information signal into a maximum coded sequence estimate; and
an uncoder applying an inverse of the generator matrix to the maximum coded sequence estimate and generating the uncoded information signal.

7. The system of claim 6, wherein the decoder is a Viterbi decoder.

8. The system of claim 5, further comprising:
a plurality of puncturing systems each applying a different puncturing matrix to the coded information signal, with each puncturing matrix having a different convolutional code rate;
a plurality of precoders each applying a different precoder matrix to the information signal, with each precoder matrix tuned to a corresponding puncturing matrix to reduce bit error rate in the corresponding transmitted punctured information signal;
a plurality of inverse puncturing systems corresponding to the plurality of puncturing systems; and a plurality of inverse precoders corresponding to the plurality of precoders.

9. An error control coding system for transmitting/receiving an information signal across a channel, said error control coding system comprising:

a precoder block including a plurality of precoders defined by a corresponding plurality of precoder matrices, the precoder block applying a select precoder matrix to the information signal and generating a precoded information signal;

an encoder applying a convolutional code defined by a generator matrix having a first convolutional code rate to the precoded information signal to generate a coded information signal at the first convolutional code rate;

a puncturing block including a plurality of puncturing systems defined by a corresponding plurality of puncturing matrices, the puncturing block applying a select puncturing matrix to the coded information signal to generate a punctured information signal at an effective second convolutional code rate higher than the first convolutional code rate, said punctured information signal transmitted across the channel, wherein the select precoder matrix is tuned to the select puncturing matrix to reduce bit error rate in the transmitted punctured information signal;

an inverse puncturing block including a plurality of inverse puncturing systems defined by a corresponding plurality of inverse puncturing matrices, the puncturing block applying an inverse of the select puncturing matrix to the transmitted punctured information signal to generate an unpunctured information signal;

a decoding system receiving the unpunctured information signal and generating an uncoded information signal; and an inverse precoder block including a plurality of inverse precoders defined by a corresponding plurality of inverse precoder matrices, the inverse precoder block applying an inverse of the select precoder matrix to the uncoded information signal to generate a transmitted information signal.

10. The system of claim 9, wherein the decoding system comprises:

a decoder mapping the unpunctured information signal into a maximum coded sequence estimate; and an uncoder applying an inverse of the generator matrix to the maximum coded sequence estimate to generate the uncoded information signal.

11. The system of claim 10, wherein the decoder comprises a Viterbi decoder.

12. The system of claim 9, wherein the first convolutional code rate of the generator matrix is selected from the group consisting of 1/2 and 1/3.

13. The system of claim 12, wherein the second convolutional code rate of the select precoder matrix is selected from the group consisting of 5/6, 4/5, 3/4, 2/3, 4/7 and 4/9.

14. A method of precoding an information signal transmitted in a punctured error control code system, said method comprising the steps of:

applying a precoder matrix to the information signal to produce a precoded information signal;

applying a generator matrix having a first convolutional code rate to the precoded information signal to produce a coded information signal;

applying a puncturing matrix having a second convolutional code rate higher than the first convolutional code rate to the coded information signal to produce a punctured information signal;

transmitting the punctured information signal across a channel;

receiving the transmitted punctured information signal;

applying an inverse of the puncturing matrix to the received punctured information signal to produce an unpunctured information signal;

decoding the unpunctured information signal to produce a maximum code estimate sequence;

applying an inverse of the generator matrix to the maximum code estimate sequence to produce an uncoded information signal; and applying an inverse of the precoder matrix to the uncoded information signal to produce a transmitted information signal, wherein the precoder matrix is tuned to the puncturing matrix so as to reduce bit error rate in the transmitted punctured information signal.

15. The method of claim 14, wherein the step of decoding the unpunctured information signal comprises the step of applying a Viterbi decoder trellis to the unpunctured information signal.

16. The method of claim 14, wherein the first convolutional code rate comprises a mother code and is chosen from the group consisting of 1/2 and 1/3.

17. The method of claim 16, wherein the second convolutional code rate is selected from the group consisting of 5/6, 4/5, 3/4, 2/3, 4/7 and 4/9.

* * * * *